United States Patent
Ihara et al.

(10) Patent No.: US 6,413,404 B1
(45) Date of Patent: Jul. 2, 2002

(54) METHOD OF FORMING BUMPS BY ELECTROPLATING

(75) Inventors: Yoshihiro Ihara; Takeo Kanazawa; Tsuyoshi Kobayashi, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/502,446

(22) Filed: Feb. 11, 2000

Related U.S. Application Data

(62) Division of application No. 09/045,919, filed on Mar. 23, 1998, now Pat. No. 6,030,512.

(30) Foreign Application Priority Data

Mar. 31, 1997 (JP) .............................. 9-81331

(51) Int. Cl.$^7$ ................................. C25D 5/02
(52) U.S. Cl. ..................... 205/133; 205/96; 205/123; 205/148; 205/170; 205/224; 205/226; 205/228
(58) Field of Search ................. 205/123, 133, 205/148, 170, 225, 226, 228, 96, 224

(56) References Cited

U.S. PATENT DOCUMENTS

| | | | | |
|---|---|---|---|---|
| 4,097,354 A | * | 6/1978 | Ginatta ........................ 204/206 |
| 4,304,641 A | | 12/1981 | Grandia et al. ................ 204/23 |
| 4,661,375 A | * | 4/1987 | Thomas ........................ 427/89 |
| 4,931,149 A | * | 6/1990 | Stierman et al. .............. 204/15 |
| 5,000,827 A | | 3/1991 | Schuster et al. .............. 204/15 |
| 5,421,987 A | | 6/1995 | Tzanavaras et al. ......... 205/133 |
| 5,534,127 A | * | 7/1996 | Sakai .......................... 205/125 |
| 5,545,429 A | * | 8/1996 | Booth et al. .................. 427/97 |
| 5,597,110 A | | 1/1997 | Melton et al. ............... 228/203 |
| 6,119,927 A | * | 9/2000 | Ramos et al. ............... 228/254 |

FOREIGN PATENT DOCUMENTS

| | | |
|---|---|---|
| JP | 56201573 | 12/1981 |
| JP | 58-104198 | 6/1983 |
| JP | 5-61359 | 6/1993 |
| JP | 08025619 | 2/1996 |
| JP | 08207357 | 8/1996 |
| JP | 9-219404 | 8/1997 |

OTHER PUBLICATIONS

Yu KK et al: "Soler Bump Fabrication By 1–3 Electroplating For Flip–Chip Applications" Proceedings Of The International Electronics Manufacturing Technolo Symposium, Santa Clara, Oct. 4–6, 1993, No. SYMP. 15, Oct. 4, 1993, pp. 277–281, Institute of Electrical and Electronics Engineers.

(List continued on next page.)

Primary Examiner—Donald R. Valentine
Assistant Examiner—William T. Leader
(74) Attorney, Agent, or Firm—Pennie & Edmonds LLP

(57) ABSTRACT

Bumps are formed by means of uniform plating in which air can be easily discharged. A plating device comprises: a plating tank 32; a holding jig 34 detachably attached to an object 35 to be plated, the holding jig 34 being connected with a cathode and electrically connected with the object 35 to be plated, the object 35 to be plated being dipped in a plating solution, by the holding jig 34, substantially vertically or obliquely to the surface of the plating solution in the plating tank so that the surface to be plated can be directed upward; a cylindrical body 39 made of insulating material arranged in the front of the object 35 to be plated held by the holding jig 34 while a short clearance is left between the cylindrical body 39 and the surface to be plated and an axial line of the cylindrical body 39 is substantially perpendicular to the surface to be plated; an anode plate 37 arranged in the cylindrical body 39 being opposed to the surface of the object 35 to be plated; and a nozzle 40 arranged in the cylindrical body 39 while it penetrates the anode plate 37 and the plating solution is jetted onto the surface to be plated from the nozzle end section located in the cylindrical body 39.

11 Claims, 5 Drawing Sheets

OTHER PUBLICATIONS

Yung E K et al. "Electroplated Solder Joints for Flip–Chip Applications", IEEE Transactions on Components, Hybrids, and Manufacturing Technology, vol. 14, No. 3, Sep. 1, 1991, pp. 549–559.

S. Watanabe et al. "Solder Bump Fabrication on Wafers By Electroplating Process", Proceedings of 1997 First International Electronic Manufacturing Technology, Apr. 16–18, 1997, pp. 110–115, Japan.

* cited by examiner

MODE A

MODE B

MODE C

MODE D

METHOD OF FORMING BUMPS BY ELECTROPLATING

This is a division of application Ser. No. 09/045,919, filed Mar. 23, 1998, now Pat. No. 6,030,512.

BACKGROUND OF THE INVENTION

1. Field of the Invention

The present invention relates to a method of forming bumps and a device for metal plating.

2. Description of the Related Art

As a method of connecting semiconductor chips with a substrate, there are known a wire bonding method, a TAB method and a flip-chip connecting method.

Since the flip-chip connecting method satisfies a demand for an increased number of connecting pin points and a decreased the signal propagation delay time, it has gradually come into wide use. Especially, because the flip-connecting method, in which solder bumps are used, is capable of forming a large number of connections all at once, it has come into very wide use. Examples of bump forming methods for connecting the flip-chips are: the electrical plating method, the vapor deposition method, and the stud bump forming method conducted by wire bonding.

It is advantageous to use the electrical plating method because it is simple and the cost is low.

Conventionally, when bumps are formed by the electrical plating method, the following method is adopted.

First, a metallic layer made of an under-barrier-metal such as Ti/Cu, Cr/Cu and Cr/Ni is formed all over a wafer, on which wiring of a circuit used for a large number of chips has already been provided, by means of sputtering or non-electrolytic plating.

A liquid photo-resist is coated on the metallic layer several times, so that a resist layer, the thickness of which is approximately 50 μm, is formed. When this resist layer is processed by means of photolithography, fine holes are formed on the resist layer, so that a portion of the metallic layer on which bumps are formed can be exposed.

Then, solder bumps are formed on the metallic layer by the electrical plating method.

Next, the resist layer is removed and the under-barrier metal, except where the bumps are formed, is removed by means of etching.

FIG. 11 is an arrangement view showing an electrical plating device commonly used for the above electrical plating method.

Reference numeral 10 is an outer tank, and reference numeral 12 is a cup facing upward. Reference numeral 14 is an anode plate horizontally arranged in a lower portion of the cup 12. Reference numeral 16 is a plating solution jet pipe which penetrates the outer tank 10 and the anode plate 14, and an end of the plating solution jet pipe is open to the lower portion of the cup 12. Reference numeral 18 is a holding jig capable of holding a wafer 20 while it is electrically connected with the wafer 20. As can be seen in the drawing, the holding jig 18 is arranged at an open portion of the cup 12 while the surface of the wafer 20 to be plated is set downward. This holding jig 18 is also used as a cathode.

As shown in the drawing, the plating solution is fed from the jet pipe 16 into the cup 12 and further jets out toward the surface of the wafer 20 to be plated. When both electrodes are energized with electric current, bumps can be formed as described before.

The plating solution overflows from a gap formed between the holding jig 18 and the brim of the cup 12 and drops into the outer tank 10. After that, the plating solution returns to the tank via the discharge pipe 22.

FIG. 12 is a view showing a profile of the bump 24 formed by the above electrical plating device.

In this connection, when the bumps are formed by the above conventional electrical plating method, the following problems may be encountered.

In the above electrical plating device, plating is conducted as follows. An 8 inch diameter wafer, having a large number of fine holes, for example, about 400,000 fine holes, is attached to the electrical plating device while the wafer is set downward, and the plating solution is jetted onto the wafer from a lower portion. Due to the above arrangement, air tends to remain in the fine holes. As a result, there are holes in which plating is not conducted at all or plating is conducted insufficiently. Therefore, the product yield is deteriorated. Especially, in the case of a wafer, it is sized so that it can be formed into small narrow chips. Accordingly, the product yield of semiconductor chips is further deteriorated.

One reason for the occurrence of variation in the formation of a plating layer is a difference in the flow rate of the plating solution between the center and the periphery. Since the brim of the cup 12 is open to the outer tank 10, the flow rate of the plating solution on the peripheral part, which overflows into the outer tank 12 of low resistance, is higher than the flow rate of the plating solution on the central part. Due to the foregoing, the thickness of the plating layer on the central part tends to be larger than that on the peripheral part.

Conventionally, it is impossible to form a plating layer of large thickness because the holes are fine in the case of a wafer. In order to solve the above conventional problem, a resist layer, the thickness of which is approximately 50 μm, is formed, and the solder bump 24 is formed into a mushroom shape as shown in FIG. 12 so that a lack of height and quantity can be made up.

However, when the solder bump 24 is formed into a mushroom shape, the diameter of the solder bump 24 is increased. In accordance with an increase in the diameter, it becomes difficult to form a pattern densely, which is opposite to the demand for an increased number of pins. Further, an upper portion of the mushroom-shaped bump tends to collapse. Therefore, it is difficult for the mushroom-shaped bumps to be subjected to the KGD (Known Good Die) electrical continuity test in which the bumps are pressed against the inspection wiring so as to check the electrical continuity.

Since the diameter of the solder bump is changed in the process of electric plating, that is, the diameter of the solder bump is gradually increased in the process of electric plating, a change is caused in the density of electric current. Therefore, in the case of solder plating, there is a possibility that the composition of solder is changed. For this reason, it is necessary to adjust the density of electric current to be constant, which is troublesome, and further it becomes necessary to provide an expensive device to adjust the density of electric current.

SUMMARY OF THE INVENTION

The present invention has been accomplished to solve the above problems. It is an object of the present invention to provide a method of forming solder bumps by which air can be easily discharged and uniform, excellent solder bumps can be formed. Also, it is an object of the present invention to provide a plating device preferably used for the method of forming solder bumps.

In order to accomplish the above object, the present invention is composed as follows.

The present invention is to provide a method of forming bumps comprising the steps of: forming a metallic layer of under-barrier-metal on a surface of an object to be plated such as a semiconductor chip; forming a resist layer on the metallic layer; exposing a portion of the metallic layer, in which bumps of the semiconductor chip are formed, by forming fine holes on the resist layer; dipping the object to be plated, which is held by a holding jig, in a plating solution substantially vertically or obliquely so that the surface of the object to be plated can be directed upward while being opposed to an anode plate after the object to be plated is held by the holding jig and the object is electrically connected with the holding jig; forming bumps in the fine holes on the metallic layer by energizing an electrode with electric current while the plating solution is being jetted against the surface to be plated from a nozzle having a nozzle section which is opposed to the surface of the object to be plated; removing the resist layer; and removing the metallic layer except where the bumps are formed.

According to the method described above, fine holes are directed in the lateral direction or the upward direction, and further the plating solution is jetted out in a direction perpendicular to the surface to be plated. Therefore, air can escape smoothly from the fine holes, and plating can be effectively executed even in the fine holes. Furthermore, since the surface to be plated is dipped in the plating solution, the flow rate of the plating solution can be made substantially uniform, and it is possible to obtain a uniform plating rate. Accordingly, it is possible to obtain a bump, the composition of which is uniform in the direction of height.

When the solder bumps reflow by heat treatment, they are formed substantially spherical except for the connecting base portions of the solder bumps.

The thickness of the resist layer and the diameter of the fine hole are adjusted so that an aspect ratio of the bump can be a value not lower than 0.5.

Even when the aspect ratio is not lower than 0.5, especially, even when the aspect ratio is not lower than 1, plating can be positively conducted in the fine holes because air can escape smoothly.

It is possible that the bumps to be formed are made of solder.

In this case, solder bumps composed of two layers are formed when plating is conducted in the fine holes on the metallic layer with solder of high melting point and then plating is conducted in the fine holes with solder of low melting point.

Due to the foregoing, the bumps are composed of the same type solder alloy. Accordingly, it is possible to form the solder bumps having a high adhesion property by which a fragile alloy between the solder and the under-barrier metal is not formed.

A cylindrical body made of insulating material is arranged on the front side of the surface of the object to be plated while a short interval is left between the cylindrical body and the surface to be plated, and a plating solution is jetted onto the surface of the object to be plated while the plating solution is shielded by the cylindrical body. Due to the above arrangement, the flow of the plating solution can be adjusted by a clearance formed between the cylindrical body and the surface of the object to be plated. Accordingly, the flow rate of the plating solution can be made uniform on the surface of the object to be plated. Therefore, it is possible to provide a uniform plating condition. As a result, it is possible to form bumps of uniform height.

A plating device of the present invention comprises: a plating tank; a holding jig detachably attached to an object to be plated, the holding jig being connected with a cathode and electrically connected with the object to be plated, the object to be plated being dipped in a plating solution, by the holding jig, substantially vertically or obliquely to the surface of the plating solution in the plating tank so that the surface to be plated can be directed upward; a cylindrical body made of insulating material arranged in the front of the object to be plated held by the holding jig while a short clearance is left between the cylindrical body and the surface to be plated and an axial line of the cylindrical body is substantially perpendicular to the surface to be plated; an anode plate arranged in the cylindrical body being opposed to the surface of the object to be plated; and a nozzle arranged in the cylindrical body while it penetrates the anode plate and the plating solution is jetted onto the surface to be plated from the nozzle end section located in the cylindrical body.

According to the device described above, it is possible to adjust the flow of the plating solution by the clearance formed between the cylindrical body and the surface of the object to be plated. Therefore, the flow rate of the plating solution can be made uniform on the surface to be plated. Accordingly it is possible to provide a plating layer of uniform thickness.

It is preferable that an insulator is attached to the back of the anode plate.

Due to the foregoing, in cooperation with the cylindrical body made of insulating material, it is possible to prevent the leakage of electric lines of force to the outside of the cylindrical body. Therefore, it is possible to enhance the plating efficiency.

It is preferable that the cylindrical body is capable of moving in the axial direction so that the distance from the cylindrical body to the surface to be plated can be adjusted.

Due to the above arrangement, it becomes possible to adjust the plating condition more finely.

It is preferable that a clearance is formed between the outer circumferential surface of the anode plate and the inner wall surface of the cylindrical body.

Due to the above arrangement, when the plating solution jets out from the nozzle, the plating solution flows into the cylindrical body from the back of the anode plate. Accordingly, the current of the plating solution in the cylindrical body can be made smooth.

It is possible that the nozzle section is composed of a shower nozzle in which a large number of small holes are formed.

It is possible that a baffle plate having a large number of small holes is arranged between the surface to be plated and the nozzle section.

BRIEF DESCRIPTION OF THE DRAWINGS

These and other objects of the present invention will become apparent from the following detailed description of the preferred embodiment of the invention, taken in connection with the accompanying drawings.

In the drawings.

DESCRIPTION OF THE PREFERRED EMBODIMENTS

Figure 1:
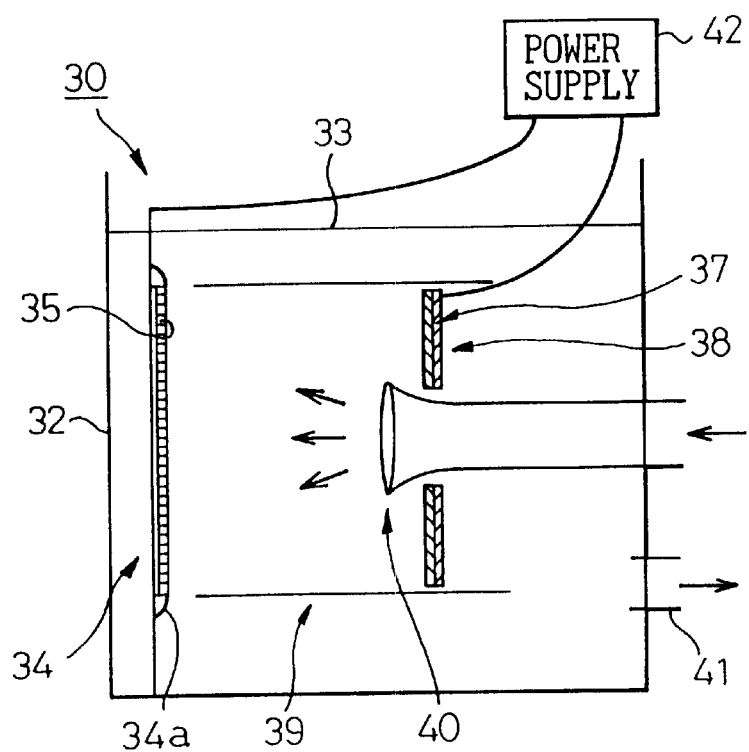
FIG. 1 is a cross-sectional schematic illustration showing the first embodiment of the plating device.

Referring to the accompanying drawings, a preferred embodiment of the present invention will be explained in detail as follows.

First, referring to FIG. 1, the plating device 30 will be explained below.

Reference numeral 32 is a plating tank, and reference numeral 33 is the level of the plating solution. Reference numeral 34 is a holding jig. The periphery of an object 35 to be plated, such as a wafer, is held by a holding claw 34a of this holding jig 34, so that the holding jig 34 can be electrically connected with the object 35 to be plated while the object to be plated is detachably held by the holding jig 34. The holding jig 34 is connected to the cathode side of an electric power source.

The object 35 to be plated is made to advance into the plating solution perpendicularly with respect to the surface of the plating solution by the holding jig 34. Although not shown in the drawing, the holding jig 34 is supported by an appropriate supporting member. In this case, the cathode rod may be used as the support member.

It is effective to arrange the holding jig 34 in such a manner that the holding jig 34 can oscillate in the vertical direction with respect to the plating solution and/or the transverse direction (the direction perpendicular to the surface of the drawing) due to an oscillating mechanism not shown in the drawing. For example, the above mechanism may be composed in such a manner that the cathode rod itself supporting the holding jig 34 is oscillated on the perpendicular surface by an appropriate crank mechanism.

Next, reference numeral 37 is an anode plate, which is arranged opposite to the surface of the object 35 to be plated located in the plating solution, and this anode plate 37 is supported by an appropriate supporting member. Reference numeral 38 is an insulating body made of a plastic which is fixed onto the back of the anode plate 37.

Reference numeral 39 is a cylindrical body made of an insulating material such as a plastic. This cylindrical body 39 is arranged in the plating solution on the front side of the surface of the object 35 to be plated while the axis of the cylindrical body 39 is set to be substantially perpendicular to the surface to be plated and a small clearance is formed between the cylindrical body 39 and the surface to be plated. It is preferable to arrange the cylindrical body 39 in such a manner that the cylindrical body 39 is capable of moving in the axial direction so that a distance from the cylindrical body 39 to the surface to be plated can be adjusted.

The anode plate 37 is arranged inside the cylindrical body 39. It is preferable that a small clearance is formed between the outer circumferential surface of the anode plate 37 and the inner wall surface of the cylindrical body 39.

Reference numeral 40 is a nozzle, the fore end nozzle portion of which penetrates the plating tank 32, the anode plate 37 and the insulating body 38 and faces the surface of the object to be plated.

A rear end portion of the nozzle 40 is connected to a plating solution tank (not shown in the drawing) via an appropriate hose. Therefore, the plating solution in the plating solution tank is jetted onto the surface to be plated by the action of a jet pump (not shown in the drawing).

In the example shown in the drawing, the nozzle portion is composed of a shower nozzle in which a large number of small holes are formed.

Reference numeral 41 is a discharge pipe through which the plating solution is returned from the plating tank 32 to the plating solution tank. That is, the plating solution is circulated, and the level of the plating solution in the plating tank 32 is kept constant at all times.

Reference numeral 42 is an electric power supply used for plating.

Figure 2:
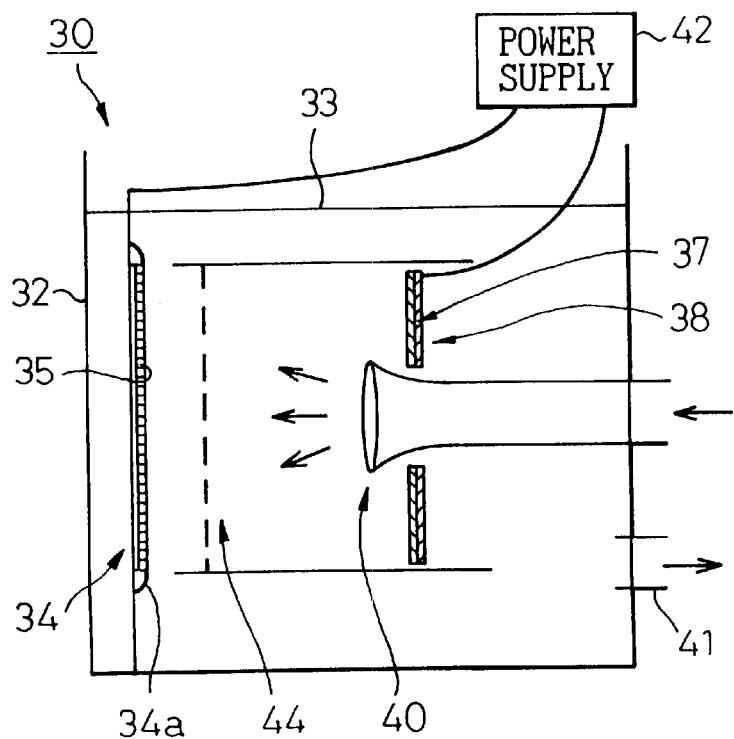
FIG. 2 is a cross-sectional schematic illustration showing the second embodiment of the plating device.
Figure 3:
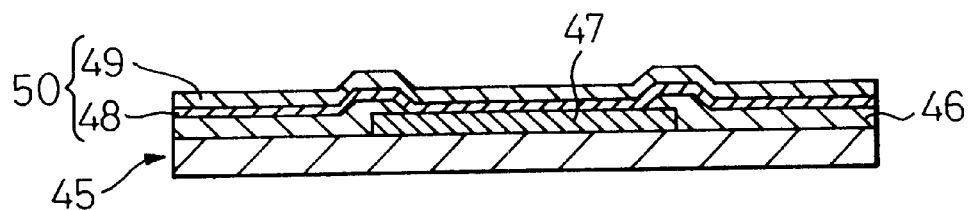
FIG. 3 is a partial cross-sectional view showing a state in which a metallic layer is formed on a wafer.

FIG. 2 is a view showing the second embodiment. The different points of the second embodiment from the first embodiment are that the nozzle section of the nozzle 40 is only formed into a trumpet-shaped blow-out port and that a baffle plate having a large number of small holes is arranged between the nozzle section and the surface of the object to be plated. Other points of the second embodiment are the same as those of the first embodiment.

Referring to FIGS. 3 to 7, a method of forming solder bumps on a wafer by the above plating device 30 will be explained as follows.

First, a metallic layer 50 composed of a Ti-layer 48 and a Cu-layer 49, is formed on a wafer 45 by means of sputtering, wherein Ti and Cu are under-barrier-metals. In this connection, reference numeral 46 is a passivation layer, and reference numeral 47 is an aluminum wiring which is a pad portion of the electrode shown in FIG. 3.

The metallic layer 50 may be a Cr-layer/Cu-layer or alternatively a Cr-layer/Ni-layer. Further, the uppermost layer may be an Au-layer or alternatively the uppermost layer may be a layer of another metal.

Figure 4:
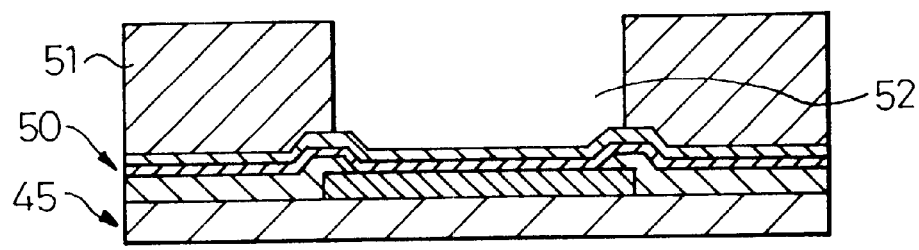
FIG. 4 is a partial cross-sectional view showing a state in which a fine hole is formed on a resist layer.

Next, as shown in FIG. 4, a photo-resist layer 51 composed of dry film is formed on the metallic layer 50, and fine holes 52 are formed by means of photolithography in a portion where solder bumps are formed, so that the metallic layer 50 can be exposed. In this example, the thickness of the photo-resist layer 51 was determined to be approximately 100 μm, however, it should be noted that the thickness is not limited to the specific value. In this example, the diameter of the fine hole 52 was determined to be approximately 100 μm. The thickness of the resist layer and the diameter of the fine hole are adjusted so that the aspect ratio (height/diameter) of a bump to be formed can be a value not lower than 0.5. Since air can escape smoothly even if the aspect ratio of the bump is not lower than 0.5 or especially even if the aspect ratio of the bump is not lower than 1, plating can be positively carried out in the fine holes.

In this case, a normal resist-layer may be formed instead of the photo-resist layer. In this case, the fine holes can be formed by laser beams generated by a excimer laser.

Reference numeral 53 is a barrier metal layer. Since the thickness of a metallic layer 50 formed by means of sputtering is too small, a barrier metal layer made of Cu or Ni is formed on the metallic layer 50 by means of electrical plating.

Figure 5:
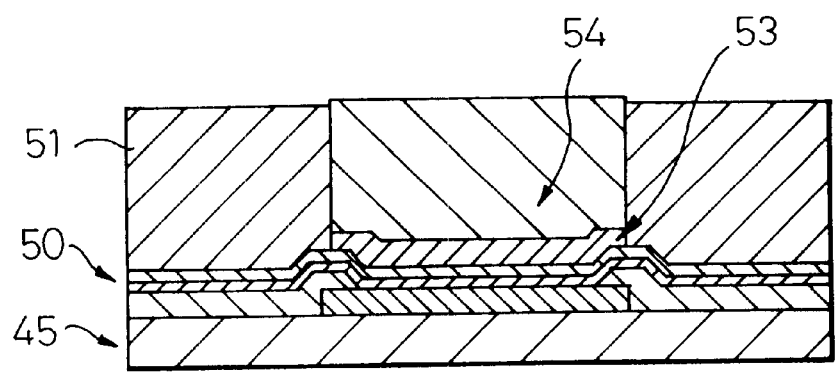
FIG. 5 is a partial cross-sectional view showing a state in which a solder bump is formed in a fine hole by means of plating.

Next, solder alloy plating is conducted on the metallic layer 50 in the fine holes 52 by the electrical plating device described before, so that the thickness of the plated metallic layer can be increased. The fine holes 52 are filled with the plated layer, that is, the plated metallic layer is formed into a column-shape. In this way, the solder bump 54, the thickness of which is approximately 100 μm, can be formed as shown in FIG. 5. The capacity of the column-shaped solder bump, the height of which is approximately 100 μm and the diameter of which is approximately 100 μm, is sufficient in the case of flip-chip connection.

Figure 6:
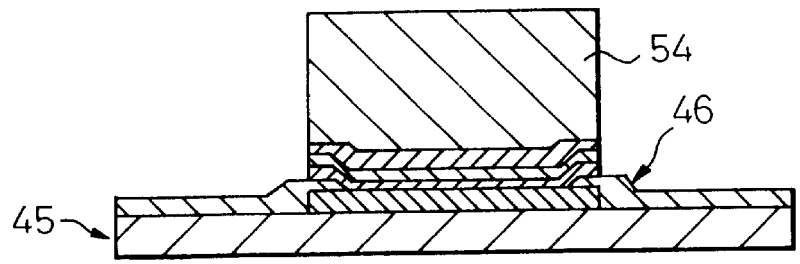
FIG. 6 is a partial cross-sectional view showing a state in which a resist layer is removed.

Next, the resist layer 51 is removed by means of etching, and the metallic layer 50, except for where the solder bumps 54 are formed, is removed by means of etching as shown in FIG. 6.

Figure 7:
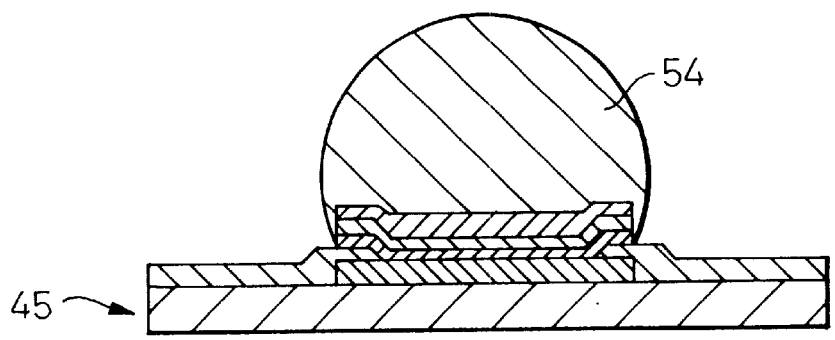
FIG. 7 is a partial cross-sectional view showing a state in which a metallic layer is removed.

Next, when heat treatment is conducted so that the metallic layer can reflow, it is possible to form spherical bumps 54 as shown in FIG. 7.

When the electrical plating device shown in FIG. 1 was used, the wafer, which was an object 35 to be plated, was directed in the perpendicular direction, so that the fine holes 52 were directed in the lateral direction and further the plating solution was jetted out from the nozzle 40 in the lateral direction. Due to the foregoing, air was smoothly discharged from the fine holes 52 and no air remained in the fine holes 52. Therefore, it was possible to positively conduct plating in each fine hole 52.

Since the overall surface to be plated on the wafer was dipped in the plating solution, after the plating solution had been jetted out from the nozzle, it flowed into the outside plating solution from a clearance formed between the periphery of the surface to be plated and the end surface of the cylindrical body 39. When the plating solution flowed out into the outside plating solution in this way, the flowing resistance was so high that the flow rate was lower than the flow rate of the conventional device shown in FIG. 11 in which the plating solution flowed into air in the outer tank 10. Accordingly, there was no big difference between the flow rate at the center of the surface to be plated and the flow rate at the periphery. Due to the foregoing, the plating rate in each fine hole 52 was substantially the same. Therefore, the thickness (height) of each solder bump 54 was made uniform.

As described above, even in the case of a fine hole, the depth of which was approximately 100 μm and the diameter of which was approximately 100 μm, no defective plating was conducted, and it was possible to obtain the solder bump 54 of uniform height.

The adhesion property of the thus obtained solder bump 54 was excellent. Further, the solder bump was formed into a column-shape of the same diameter.

Therefore, the density of electric current was substantially the same, and the composition of solder was uniform with respect to the direction of height.

Since it was possible to form a column-shape solder bump 54 of uniform height, the KGD inspection was easily and positively conducted in which the bumps were pressed against the wiring pattern for inspection so as conduct an electrical continuity test.

In this connection, since the flow of the plating solution is adjusted by the clearance formed between the surface to be plated and the end surface of the cylindrical body 39, a turbulent flow of the plating solution is formed all over the surface to be plated by the flow resistance. Due to the foregoing, the plating solution comes completely into contact with the surface to be plated, which is one of the reasons why the precipitation rate of plating is uniform. The above clearance is changed in accordance with the size of the object to be plated. This adjustment is conducted when the cylindrical body 39 is appropriately moved in the axial direction.

The clearance between the outer circumferential surface of the anode plate 37 and the inner wall surface of the cylindrical body 39 is not necessarily formed. However, when this clearance is provided, the plating solution flows from the rear side of the anode plate 37 into the cylindrical body 39 in accordance with the flow of the plating solution jetted out from the nozzle 40. Due to the foregoing, the plating solution flows smoothly in the cylindrical body 39.

When the cylindrical body 39 is made of insulating material and the insulating member 38 is fixed onto the back of the anode plate 37, it becomes possible to prevent the electric lines of force from leaking outside the cylindrical body 39. Accordingly, it is possible to enhance the plating efficiency.

In this connection, when the object to be plated is changed, for example, when the object to be plated is changed from an 8 inch wafer to a 4 inch wafer, the cylindrical body 39 may be replaced with another one, the diameter of which corresponds to the size of the wafer. When the cylindrical body 39 is replaced, it is moved to the front of the anode plate 37. In this way, the cylindrical body 39 can be easily disconnected from the plating tank 32 and replaced with another one.

The cylindrical body 39 may not be necessarily arranged depending upon the type of the object to be plated.

Figure 11:
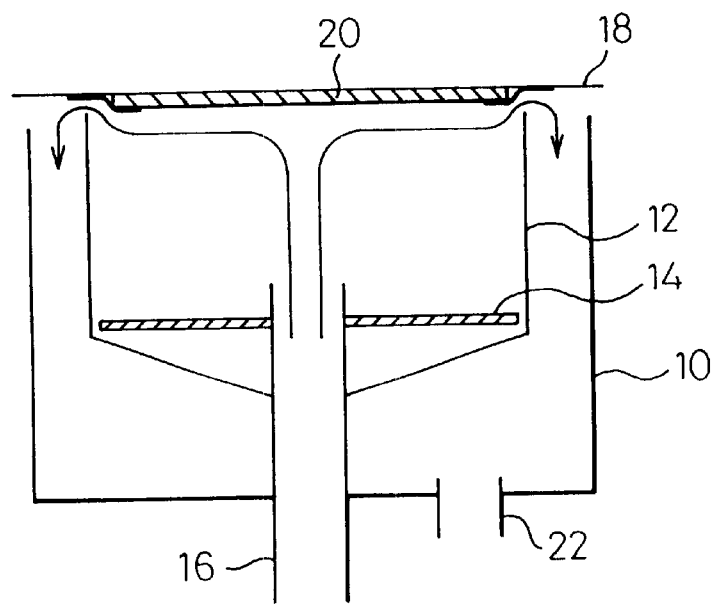
FIG. 11 is a schematic illustration of the conventional plating device.
Figure 12:
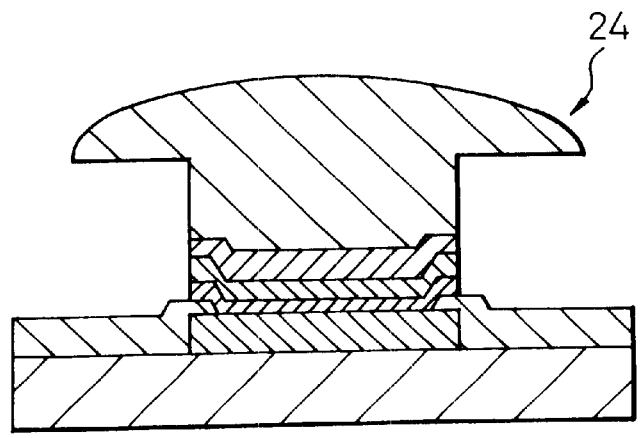
FIG. 12 is a schematic illustration showing an example of the profile of the solder bump formed by the conventional electrical plating method.

Table 1 shows ratios of the shape of plating in the case where the plating device shown in FIG. 1 or 2 was used and also in the case where the conventional plating device shown in FIG. 11 was used.

TABLE 1

|  | Conventional Device | Device shown in FIG. 1 |
| --- | --- | --- |
| Mode A | 8.3 | 0 |
| Mode B | 35.9 | 0 |
| Mode C | 56.8 | 100 |
| Mode D | 0 | 0 |

Ratios (%) of the shape of plating in each mode

Figure 8A:
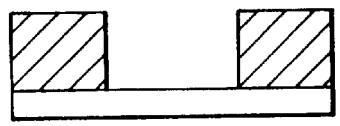
FIG. 8A is a schematic illustration showing an example of the plating profile.
Figure 8B:
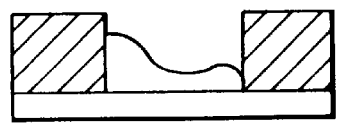
FIG. 8B is a schematic illustration showing another example of the plating profile.

When the conventional plating device was used, the defect of Mode A, in which the plated layer was not attached onto the wafer as shown in FIG. 8A, was 8.3%, and the defect of Mode B (FIG. 8B), in which the defect occurred when the plating solution flowed in parallel with the wafer, was approximately 40%.

Figure 8C:
FIG. 8C is a schematic illustration showing a further example of the plating profile.
Figure 8D:
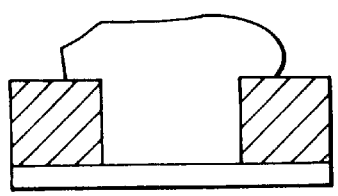
FIG. 8D is a schematic illustration showing a yet further example of the plating profile.

On the other hand, when the plating device shown in FIG. 1 was used, since the fine holes were arranged in the lateral direction and the plating solution was jetted out onto the surface to be plated in the lateral direction, air easily escaped. Accordingly, no defect was caused in Mode A, Mode B and Mode D (FIG. 8D), and the percentage of good bumps was 100%. In this experiment, plating was conducted aiming at Mode C (FIG. 8C).

Figure 9:
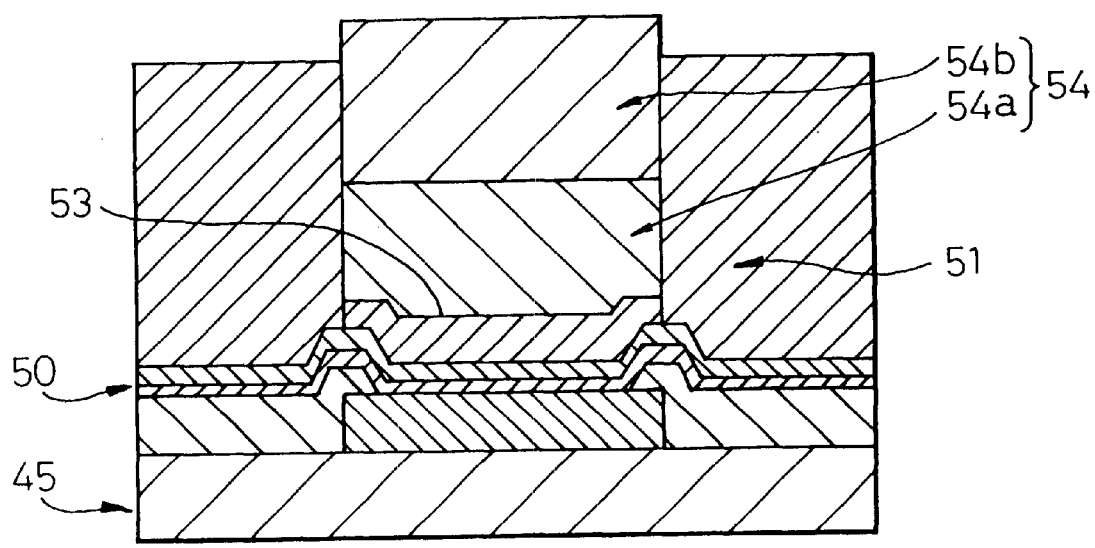
FIG. 9 is a partial cross-sectional view of an example in which a solder bump is made of solder alloy of two layers.
Figure 10:
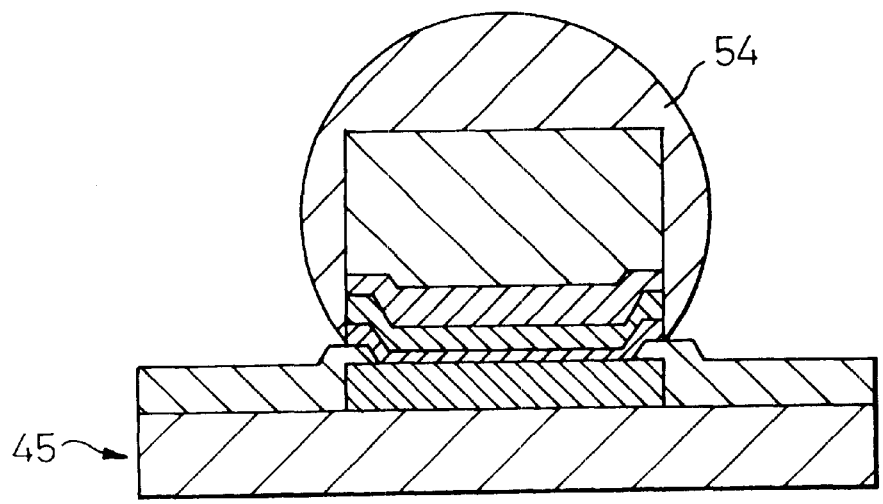
FIG. 10 is a partial cross-sectional view showing a state in which a solder bump is made to reflow.

FIGS. 9 and 10 are views respectively showing an example in which the solder bump 54 is composed of two layers of solder.

That is, the lower layer (the layer on the metallic layer 50 side) is composed of a high melting point solder section 54a, the melting point of which is high because the tin content is low, and the upper layer is composed of a low melting point solder section 54b, the melting point of which is low because the tin content is high.

In order to form the two layers described above, first, the high melting point solder section 54a is formed in a plating bath of high melting point solder, and then the plating tank is changed, and the low melting point solder section 54b is formed in a plating bath of low melting point solder.

When the low melting point solder section 54b is made to reflow, it is possible to form a substantially spherical solder bump 54 as shown in FIG. 10.

When the bump 54 is made of the high melting point solder section 54a, which is a core of the bump, since the bump is made of the same type metal (solder alloy), the high melting point solder section and the low melting point solder section adhere to each other tightly and the mechanical strength is high, and further since the core is provided in the bump, it can not be damaged in the process of mounting.

Since the core is composed of the high melting point solder section 54a, the tin content of which is low, even if the under-barrier-metal is copper, there is no possibility of the formation of tin-copper alloy which is fragile. Accordingly, the solder adheres to the under-layer strongly, and the copper layer is not damaged. Therefore, the aluminum wiring can be sufficiently protected.

In the plating device 30 shown in FIG. 1 or 2, the object to be plated is held by the holding jig 34 and dipped in the plating solution while it is held perpendicularly to the surface of the plating solution.

However, the object to be plated may be dipped in the plating solution while it is held obliquely to the surface of the plating solution so that the plating surface can be directed upward (not shown in the drawing). In accordance with the above oblique arrangement of the object to be plated, the cylindrical body 39 and the nozzle 40 are also arranged obliquely.

In this case, since the fine holes on the wafer are directed upward, air can escape from the fine holes more easily although it becomes difficult to set the holding jig 34 in the plating solution and also it becomes difficult to pick up the holding jig 34 from the plating solution.

In the above embodiments, the bumps are made of solder alloy, however, it is possible to apply the present invention to the bumps made of other metals such as nickel and gold. The lower layer of the bump may be made of nickel, and the upper layer of the bump may be made of gold, that is, the lower and the upper layer may be made of the same or the different type metals, the number of which is not less than two.

It is preferable to apply the above plating device 30 to the formation of solder bumps used for a micro BGA package or a wafer. Especially, it is preferable to apply the above plating device 30 to the formation of solder bumps used for a wafer. Of course, the above plating device 30 can be put into common use. Even in this case, it is possible to form a uniform plated layer on an inner wall in a small space.

According to the invention, the fine holes are directed in the lateral direction or the upward direction, and further the plating solution is jetted out in the perpendicular direction to the surface of an object to be plated. Therefore, air can easily escape from the fine holes, and it becomes possible to conduct plating even in the fine holes. Further, since the surface of the object to be plated is dipped in the plating solution, the flow rate of the plating solution jetted out from the nozzle becomes substantially uniform, and it becomes possible to obtain a uniform precipitation rate. Accordingly, it is possible to form a bump which is uniform in composition in the direction of height.

It is to be understood that the invention is by no means limited to the specific embodiments illustrated and described herein, and that various modifications thereto may be made which come within the scope of the present invention as defined in the appended claims.

What is claimed is:

1. A method of forming bumps comprising the steps of:
   forming a metallic layer of under-barrier metal on a surface of an object to be plated;
   forming a resist layer on the metallic layer,
   exposing a portion of the metallic layer, on which bumps are formed on the object by forming fine holes on the resist layer,
   dipping the object, held by a holding jig, in a plating solution substantially vertically or obliquely so that the surface of the object is directed laterally or at a non-zero upward angle, respectively, and wherein the object is opposed to an anode plate while the object is held by the holding jig, and the object is electrically connected with the holding jig;
   arranging a cylindrical body made of an insulating material in front of the surface of the object to be plated so that a short interval is left between the cylindrical body and the surface to be plated, and wherein a clearance is formed between an outer circumferential surface of the anode plate and the inner wall surface of the cylindrical body;
   arranging a nozzle in the cylindrical body and so that an end of the nozzle penetrates the anode plate, and jetting plating solution from the nozzle end section located in the cylindrical body onto the surface of the object to be plated;
   forming bumps in the fine holes on the metallic layer by energizing an electrode with electric current while the plating solution is being jetted against the surface to be plated from a nozzle having a nozzle section which is opposed to the surface of the object;
   removing the resist layer; and
   removing a portion of the metallic layer except for the portion of the metallic layer on which the bumps are formed.

2. The method of forming bumps according to claim 1, wherein a thickness of the resist layer and a diameter of the fine holes are adjusted so that an aspect ratio of the bump are a value not lower than 0.5.

3. The method of forming bumps according to claim 1, wherein the bumps to be formed are made of solder.

4. The method of forming bumps according to claim 3, wherein solder bumps composed of two layers are formed when plating is conducted, in the fine holes on the metallic layer, with solder of a high melting point and then plating is conducted in the fine holes with solder of a low melting point.

5. The method of forming solder bumps according to claim 3, wherein solder bumps are reflowed by heat treatment, and wherein the solder bumps are formed substantially spherical except for connecting base portions of the solder bumps.

6. The method of claim 1, wherein the surface of the object is directed at a non-zero upward angle.

7. The method of claim 1, wherein the surface of the object is directed laterally.

8. A method of forming bumps comprising the steps of:
forming a metallic layer on a surface of a substrate;
forming a resist layer on the metallic layer;
exposing at least a portion of the metallic layer by forming fine holes in the resist layer;
covering the surface of the substrate with a plating solution, and orienting the surface such that the fine holes are directed at a on-zero upward angle;
arranging a cylindrical body made of an insulating material in front of the surface of the substrate to be plated so that a short interval is left between the cylindrical body and the surface to be plated, and wherein an anode plate is opposed to the substrate such that a clearance is formed between an outer circumferential surface of the anode plate and the inner wall surface of the cylindrical body;
arranging a nozzle in the cylindrical body and so that an end of the nozzle penetrates the anode plate, and jetting plating solution from the nozzle end section located in the cylindrical body onto the surface of the object to be plated;
jetting the plating solution in a direction perpendicular to the metallic layer while applying an electroplating current, such that air is permitted to escape from the fine holes and bumps are formed on the metallic layer;
removing the resist layer; and
removing areas of the metallic layer having no bumps formed thereon.

9. The method according to claim 8, comprising the step of adjusting a thickness of the resist layer and a diameter of the fine holes such that aspect ratios of the formed bumps are not lower than 0.5.

10. A method of forming bumps comprising the steps of:
forming a metallic layer on a surface of a substrate;
forming a resist layer on the metallic layer;
exposing at least a portion of the metallic layer by forming fine holes in the resist layer;
covering the surface of the substrate with a plating solution, and orienting the surface such that the fine holes are directed in a lateral direction which is substantially perpendicular to an upper surface of the of the plating solution;
arranging a cylindrical body made of an insulating material in front of the surface of the substrate to be plated so that a short interval is left between the cylindrical body and the surface to be plated, and wherein an anode plate is opposed to the substrate such that a clearance is formed between an outer circumferential surface of the anode plate and the inner wall surface of the cylindrical body;
arranging a nozzle in the cylindrical body and so that an end of the nozzle penetrates the anode plate, and jetting plating solution from the nozzle end section located in the cylindrical body onto the surface of the object to be plated;
jetting the plating solution in a direction perpendicular to the metallic layer while applying an electroplating current, such that air is permitted to escape from the fine holes and bumps are formed on the metallic layer;
removing the resist layer; and
removing areas of the metallic layer having no bumps formed thereon.

11. The method according to claim 10, comprising the step of adjusting a thickness of the resist layer and a diameter of the fine holes such that aspect ratios of the formed bumps are not lower than 0.5.

* * * * *